(12) United States Patent
Itasaka

(10) Patent No.: US 9,350,291 B2
(45) Date of Patent: May 24, 2016

(54) OSCILLATION CIRCUIT, OSCILLATOR, ELECTRONIC APPARATUS, AND MOVING OBJECT

(71) Applicant: Seiko Epson Corporation, Tokyo (JP)

(72) Inventor: Yosuke Itasaka, Tatsuno (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/580,811

(22) Filed: Dec. 23, 2014

(65) Prior Publication Data

US 2015/0180413 A1 Jun. 25, 2015

(30) Foreign Application Priority Data

Dec. 25, 2013 (JP) ................................ 2013-267751

(51) Int. Cl.
  *H03B 5/04* (2006.01)
  *H03B 5/36* (2006.01)

(52) U.S. Cl.
  CPC ................. *H03B 5/04* (2013.01); *H03B 5/362* (2013.01); *H03B 5/368* (2013.01)

(58) Field of Classification Search
  CPC ......................................................... H03B 5/32
  USPC ................................................. 331/154, 160
  See application file for complete search history.

(56) References Cited

U.S. PATENT DOCUMENTS

| 5,004,988 | A | 4/1991 | Ueno et al. |
| 5,898,345 | A | 4/1999 | Namura et al. |
| 6,731,181 | B2 | 5/2004 | Fukayama et al. |
| 8,564,378 | B2 * | 10/2013 | Takahashi ................ H03B 5/36 331/109 |

FOREIGN PATENT DOCUMENTS

| JP | 02-035804 A | 2/1990 |
| JP | 05-075446 A | 3/1993 |
| JP | 06-318820 A | 11/1994 |
| JP | 09-298421 A | 11/1997 |
| JP | 09-298422 A | 11/1997 |
| JP | 10-056329 A | 2/1998 |
| JP | 11-346116 A | 12/1999 |
| JP | 2009-124401 A | 6/2009 |
| JP | 2010-219738 A | 9/2010 |
| WO | WO-02-19514 A1 | 3/2002 |

* cited by examiner

*Primary Examiner* — Joseph Chang
(74) *Attorney, Agent, or Firm* — Harness, Dickey & Pierce, P.L.C.

(57) ABSTRACT

An oscillation circuit includes an oscillating section configured to output an oscillation signal, a first characteristic adjusting section including a first terminal, which is electrically connected to the oscillating section, and configured to adjust characteristics of the oscillation signal output by the oscillating section, a second characteristic adjusting section including a first terminal electrically connected to the oscillating section and configured to adjust the characteristics of the oscillation signal output by the oscillating section, and a voltage applying section (a first voltage applying section) configured to apply a first voltage to the first terminal of the first characteristic adjusting section and the first terminal of the second characteristic adjusting section and apply a second voltage, which is different from the first voltage and changes in association with the first voltage, to a second terminal of the first characteristic adjusting section.

14 Claims, 9 Drawing Sheets

OSCILLATION CIRCUIT, OSCILLATOR, ELECTRONIC APPARATUS, AND MOVING OBJECT

BACKGROUND

1. Technical Field

The present invention relates to an oscillation circuit, an oscillator, an electronic apparatus, and a moving object.

2. Related Art

There is a known method of applying a voltage to a variable capacitance element arranged in an oscillation circuit and changing the capacitance of the variable capacitance element in order to vary the frequency of the oscillation circuit. An oscillator that controls a frequency with a voltage is generally called VCXO (Voltage Controlled X'tal Oscillator). There is also a TCXO (Temperature Compensated X'tal Oscillator) that reduces a frequency deviation with respect to temperature using this principle.

In recent years, quartz crystal oscillators have been reduced in size. Integration of an oscillation circuit is ongoing. However, since a variable amount of a usable variable capacitance element is limited when an integrated circuit is used, a necessary frequency variable width and necessary linearity cannot be obtained.

WO 02/19514 discloses an oscillator in which a frequency adjusting voltage and a temperature compensation voltage are added up by an adder circuit and applied to a frequency adjustment circuit.

In WO 02/19514, the frequency adjusting voltage and the temperature compensation voltage are added up and applied to the frequency adjustment circuit. Therefore, compared with when frequency adjustment and temperature compensation are independently performed, a frequency width that can be varied by the frequency adjustment circuit has to be increased. Therefore, for example, when a variable capacitor is used in the frequency adjustment circuit, compared with when the frequency adjustment and the temperature compensation are independently performed, it is likely that a frequency variable width is insufficient if only a region with high linearity of variable capacitance sensitivity is used. It is likely that the accuracy of the frequency adjustment is deteriorated if a region wider than the region with the high linearity of the variable capacitance sensitivity is used.

SUMMARY

An advantage of some aspects of the invention is to provide an oscillation circuit, an oscillator, an electronic apparatus, and a moving object that can increase a variable width of frequency adjustment while suppressing deterioration in accuracy of the frequency adjustment.

The invention can be implemented as the following aspects or application examples.

Application Example 1

An oscillation circuit according to this application example includes: an oscillating section configured to output an oscillation signal; a first characteristic adjusting section and a second characteristic adjusting section including first terminals, which are respectively electrically connected to the oscillating section, and configured to adjust characteristics of the oscillation signal; and a voltage applying section configured to apply a first voltage to the first terminal of the first characteristic adjusting section and the first terminal of the second characteristic adjusting section and apply a second voltage, which is different from the first voltage and changes in association with the first voltage, to a second terminal of the first characteristic adjusting section.

According to this application example, the voltage applying section changes the second voltage in association with the first voltage. Therefore, for example, when variable capacitance elements are used in the first characteristic adjusting section and the second characteristic adjusting section, it is easy to set a median of a voltage between both ends of the first characteristic adjusting section in a range in which linearity of the variable capacitance element is high. The first characteristic adjusting section and the second characteristic adjusting section can be independently controlled. Therefore, for example, when variable capacitance elements are used in the first characteristic adjusting section and the second characteristic adjusting section, compared with when frequency adjustment is performed by one variable capacitance element, it is possible to increase a variable width of the frequency adjustment. Therefore, it is possible to realize the oscillation circuit that can increase the variable width while suppressing deterioration in accuracy of the frequency adjustment.

Application Example 2

In the oscillation circuit according to the application example described above, it is preferable that the first characteristic adjusting section and the second characteristic adjusting section include variable capacitance elements.

According to this application example, by controlling voltages between both terminals of the variable capacitance elements to thereby control capacitance values of the variable capacitance elements, it is possible to control the frequency of an oscillation signal output by the oscillation circuit.

Application Example 3

In the oscillation circuit according to the application example described above, it is preferable that the voltage applying section includes a first variable resistance section and a second variable resistance section connected in series via a resistor, outputs the first voltage and the second voltage from between the first variable resistance section and the second variable resistance section, and changes the magnitude of a resistance value of the first variable resistance section and the magnitude of a resistance value of the second variable resistance section in association with each other to be changed oppositely.

According to this application example, by changing the magnitudes of the resistance values of the first variable resistance section and the second variable resistance section in association with each other, it is possible to change the second voltage in association with the first voltage. Therefore, it is possible to realize the oscillation circuit that can increase a variable width of frequency adjustment while suppressing deterioration in accuracy of the frequency adjustment.

Application Example 4

In the oscillation circuit according to the application example described above, it is preferable that the oscillation circuit further includes a storing section configured to store setting information for changing the first voltage and the second voltage in association with each other, and the voltage applying section controls the first voltage and the second voltage on the basis of the setting information.

According to this application example, the first voltage and the second voltage can be controlled on the basis of the setting information stored in the storing section. Therefore, it is possible to easily use a desired frequency as the frequency of the oscillation signal output by the oscillation circuit.

Application Example 5

An oscillation circuit according to this application example includes: an oscillating section configured to output an oscillation signal; a first characteristic adjusting section and a second characteristic adjusting section electrically connected to the oscillating section and configured to adjust characteristics of the oscillation signal; and a voltage applying section configured to output a first voltage and a second voltage which is different from the first voltage to the first characteristic adjusting section and the second characteristic adjusting section, apply the first voltage to the second characteristic adjusting section, and apply a differential voltage between the first voltage and the second voltage, which changes in association with the first voltage, to the first characteristic adjusting section.

According to this application example, the voltage applying section changes the second voltage in association with the first voltage. Therefore, for example, when variable capacitance elements are used in the first characteristic adjusting section and the second characteristic adjusting section, it is easy to set a median of a voltage between both ends of the first characteristic adjusting section in a range in which linearity of the variable capacitance element is high. The first characteristic adjusting section and the second characteristic adjusting section can be independently controlled. Therefore, for example, when variable capacitance elements are used in the first characteristic adjusting section and the second characteristic adjusting section, compared with when frequency adjustment is performed by one variable capacitance element, it is possible to increase a variable width of the frequency adjustment. Therefore, it is possible to realize the oscillation circuit that can increase the variable width while suppressing deterioration in accuracy of the frequency adjustment.

Application Example 6

An oscillator according to this application example includes: the oscillation circuit according to any one of the application examples described above; and a resonator.

According to this application example, the oscillator includes the oscillation circuit that can increase a variable with while suppressing deterioration in accuracy of frequency adjustment. Therefore, it is possible to realize the oscillator that can increase a variable with while suppressing deterioration in accuracy of frequency adjustment.

Application Example 7

An electronic apparatus according to this application example includes the oscillation circuit according to any one of the application examples described above.

Application Example 8

A moving object according to this application example includes the oscillation circuit according to any one of the application examples described above.

According to these application examples, the electronic apparatus and the moving object include the oscillation circuit or the oscillator that can increase a variable width of frequency adjustment while suppressing deterioration in accuracy of the frequency adjustment. Therefore, it is possible to realize the electronic apparatus and the moving object having high accuracy of an operation.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Preferred embodiments of the invention are explained in detail below with reference to the drawings. The drawings referred to below are for convenience of explanation. Note that the embodiments explained below do not unduly limit the contents of the invention described in the appended claims. Not all components explained below are essential constituent elements of the invention.

1. An Oscillation Circuit and an Oscillator 1-1. First Embodiment

Figure 1:
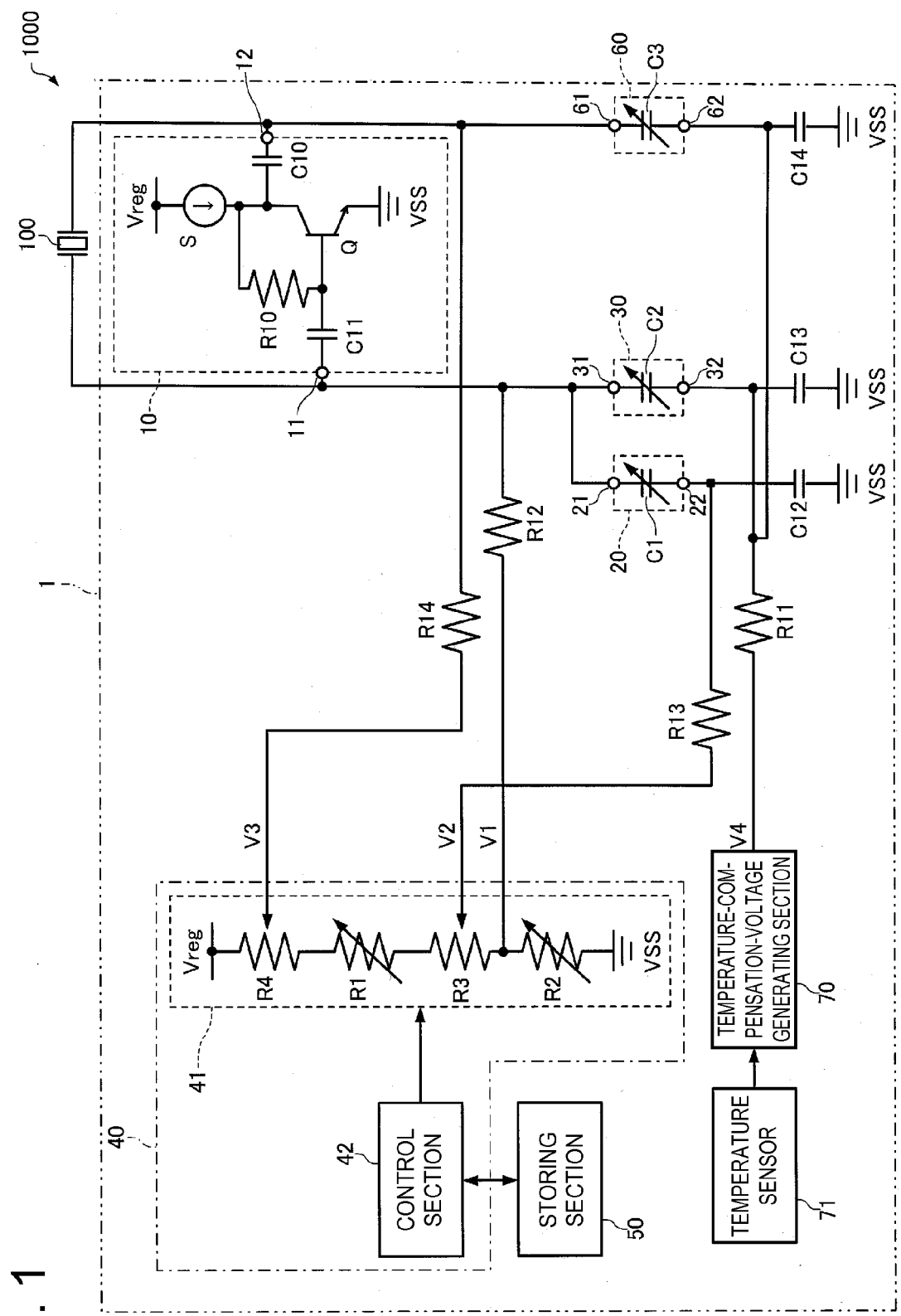
FIG. 1 is a circuit diagram showing an oscillation circuit and an oscillator according to a first embodiment.

FIG. 1 is a circuit diagram showing an oscillation circuit 1 and an oscillator 1000 according to a first embodiment. A part or all of the oscillation circuit 1 may be configured by a semiconductor device.

The oscillator 1000 according to this application example includes the oscillation circuit 1 and a resonator 100. As the resonator 100, various resonators such as a quartz crystal resonator (a piezoelectric resonator), a SAW resonator, a piezoelectric resonator including piezoelectric ceramics, and an MEMS (Micro electro Mechanical Systems) resonator can be adopted.

The oscillation circuit 1 according to this embodiment includes an oscillating section that outputs an oscillation signal, a first characteristic adjusting section and a second characteristic adjusting section that are electrically connected to the oscillating section and adjust characteristics of the oscillation signal, and a voltage applying section that outputs a first voltage V1 and a second voltage V2 which is different from the first voltage V1 to the first characteristic adjusting section and the second characteristic adjusting section, applies the first voltage V1 to the first characteristic adjusting section, and applies a differential voltage between the first voltage V1 and the second voltage V2, which changes in association with the first voltage V1, to the first characteristic adjusting section.

More specifically, the oscillation circuit 1 includes an oscillating section 10 that outputs an oscillation signal, a first characteristic adjusting section 20 that includes a first terminal 21 electrically connected to the oscillating section 10 and adjusts characteristics of the oscillation signal output by the oscillating section 10, a second characteristic adjusting section 30 that includes a first terminal 31 electrically connected to the oscillating section 10 and adjusts the characteristics of the oscillation signal output by the oscillating section 10, and a voltage applying section 40 (a first voltage applying section) that applies the first voltage V1 to the first terminal 21 of the first characteristic adjusting section 20 and the first terminal 31 of the second characteristic adjusting section 30 and applies the second voltage V2, which is different from the first voltage V1 and changes in association with the first voltage V1, to a second terminal 22 of the first characteristic adjusting section 20.

The oscillating section is realized as the oscillating section 10. The first characteristic adjusting section is realized as the first characteristic adjusting section 20. The second characteristic adjusting section is realized as the second characteristic adjusting section 30. The voltage applying section is realized as the voltage applying section 40.

The oscillating section 10 is electrically connected to the resonator 100 and performs an oscillating operation. As the oscillating section 10, various oscillation circuits such as a Pierce oscillation circuit, an inverter-type oscillation circuit, a Colpitts oscillation circuit, and a Hartley oscillation circuit can be adopted. In this embodiment, the oscillating section 10 is a Colpitts oscillation circuit.

In an example shown in FIG. 1, the oscillating section 10 includes a first terminal 11, a second terminal 12, an NPN transistor Q, a capacitive element C10, a capacitive element C11, a resistor R10, and a current source S. The first terminal 11 is electrically connected to one end of the resonator 100. The second terminal 12 is electrically connected to the other end of the resonator 100. A base terminal of the NPN transistor Q is connected to the first terminal 11 via the capacitive element C10 and connected to a collector terminal of the NPN transistor Q via the resistor R10. The collector terminal of the NPN transistor Q is connected to a power supply potential Vreg via the current source S and connected to the second terminal 12 via the capacitive element C10. An emitter terminal of the NPN transistor Q is connected to a ground potential VSS. The oscillating section 10 outputs an oscillation signal from the second terminal 12.

The first characteristic adjusting section 20 and the second characteristic adjusting section 30 adjust characteristics of the oscillation signal output by the oscillating section 10. More specifically, the first characteristic adjusting section 20 and the second characteristic adjusting section 30 adjust the frequency of the oscillation signal output by the oscillating section 10. The first characteristic adjusting section 20 may be used for, for example, fine adjustment of the frequency of the oscillation circuit 1. The second characteristic adjusting section 30 may be used for, for example, compensating for fluctuation in a frequency due to a temperature characteristic of the resonator 100. The first characteristic adjusting section 20 includes the first terminal 21 and the second terminal 22.

The second characteristic adjusting section 30 includes the first terminal 31 and a second terminal 32.

The first terminal 21 of the first characteristic adjusting section 20 and the first terminal 31 of the second characteristic adjusting section 30 are electrically connected to the first terminal 11 of the oscillating section 10. The first terminal 21 of the first characteristic adjusting section 20 and the first terminal 31 of the second characteristic adjusting section 30 are electrically connected to one end of the resonator 100.

In the example shown in FIG. 1, the second terminal of the first characteristic adjusting section 20 is connected to the ground potential VSS via a capacitive element C12. The second terminal 32 of the second characteristic adjusting section 30 is connected to the ground potential VSS via a capacitive element C13.

In the example shown in FIG. 1, the first characteristic adjusting section 20 includes a variable capacitance element C1. The second characteristic adjusting section 30 includes a variable capacitance element C2. As the variable capacitance element C1 and the variable capacitance element C2, for example, a MOS-type variable capacitance element can be adopted. As the MOS-type variable capacitance element, for example, a variable capacitance diode (varicap diode), the capacitance of which changes according to a voltage between both ends, can be adopted.

The oscillation circuit 1 may include a third characteristic adjusting section 60 that adjusts characteristics of the oscillation signal output by the oscillating section 10. The third characteristic adjusting section 60 may be used for, for example, compensating for fluctuation in a frequency due to a temperature characteristic of the resonator 100. In the example shown in FIG. 1, the third characteristic adjusting section 60 includes a first terminal 61 and a second terminal 62. The first terminal 61 of the third characteristic adjusting section 60 is electrically connected to the second terminal 12 of the oscillating section 10. The second terminal 62 of the third characteristic adjusting section 60 is connected to the ground potential VSS via a capacitive element C14. In the example shown in FIG. 1, the third characteristic adjusting section 60 includes a variable capacitance element C3. As the variable capacitance element C3, for example, a variable capacitance diode can be adopted.

The voltage applying section 40 applies voltages to the first characteristic adjusting section 20 and the second characteristic adjusting section 30. In the example shown in FIG. 1, the voltage applying section 40 includes a voltage generating section 41 that generates a voltage and a control section 42 that controls the voltage generating section 41.

In the example shown in FIG. 1, in the voltage generating section 41, a resistor R4, a first variable resistance section R1, a resistor R3, and a second variable resistance section R2 are connected in order in series between the power supply potential Vreg and the ground potential VSS. That is, the voltage generating section 41 divides, with the resistor R4, the first variable resistance section R1, the resistor R3, and the second variable resistance section R2, a voltage between the power supply potential Vreg and the ground potential VSS to thereby generate a desired voltage.

The voltage applying section 40 applies the first voltage V1 to the first terminal 21 of the first characteristic adjusting section 20 and the first terminal 31 of the second characteristic adjusting section 30. In the example shown in FIG. 1, the voltage generating section 41 applies a voltage generated at a connection point of the second variable resistance section R2 and the resistor R3 to the first terminal 21 of the first characteristic adjusting section 20 and the first terminal 31 of the second characteristic adjusting section 30 via a resistor R12 as the first voltage V1.

The voltage applying section 40 applies the second voltage V2 which is different from the first voltage V1 to the second terminal 22 of the first characteristic adjusting section 20. In the example shown in FIG. 1, the voltage generating section 41 applies a voltage generated by the resistor R3 to the second terminal 22 of the first characteristic adjusting section 20 via a resistor R13.

The voltage applying section 40 may apply a third voltage V3 which is different from the first voltage V1 and the second voltage V2 to the first terminal 61 of the third characteristic adjusting section 60. In the example shown in FIG. 1, the voltage generating section 41 applies a voltage generated by the resistor R4 to the second terminal 62 of the third characteristic adjusting section 60 via a resistor R14.

The voltage applying section 40 changes the second voltage V2 in association with the first voltage V1. Preferably, the voltage applying section 40 changes the second voltage V2 to set the magnitude of a change in a difference between the second voltage V2 and the first voltage V1 to be smaller than the magnitude of a change in the first voltage V1. More preferably, the voltage applying section 40 changes the second voltage V2 to fix the difference between the second voltage V2 and the first voltage V1.

Figure 2:
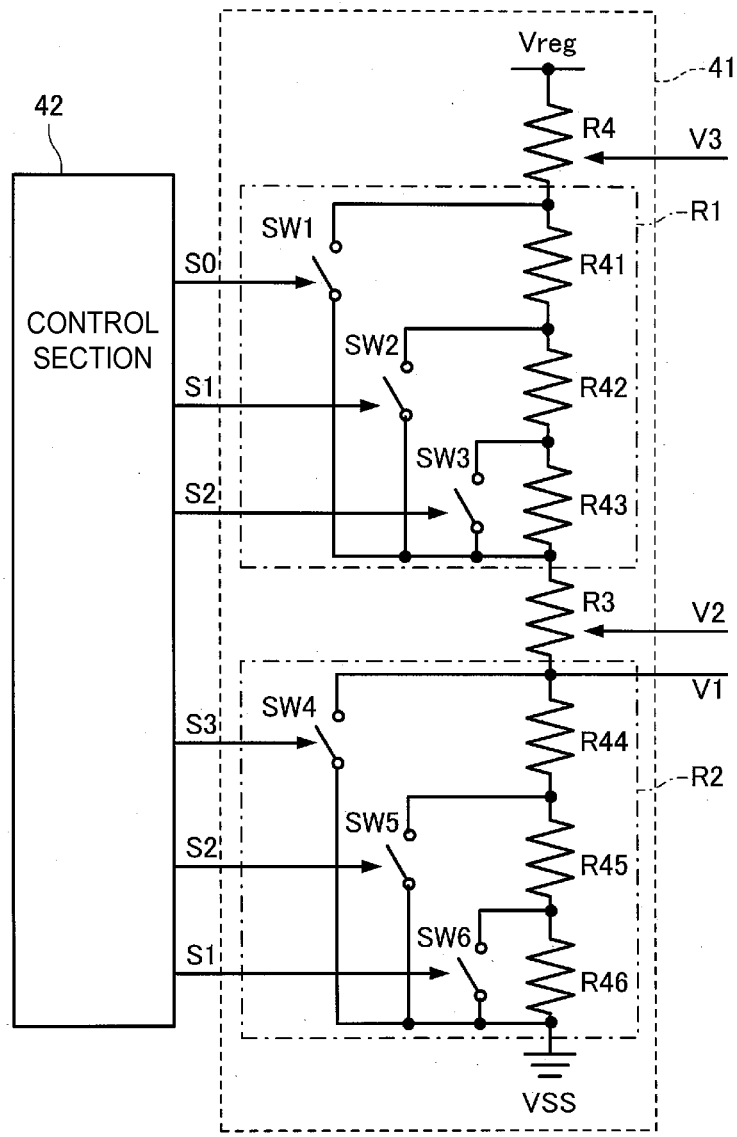
FIG. 2 is a circuit diagram showing a specific configuration example of a voltage applying section.

FIG. 2 is a circuit diagram showing a specific configuration diagram of the voltage applying section 40. The voltage applying section 40 includes the first variable resistance section R1 and the second variable resistance section R2 connected in series via the resistor R3. The voltage applying section 40 outputs the first voltage V1 and the second voltage V2 from between the first variable resistance section R1 and the second variable resistance section R2 and changes the magnitude of a resistance value of the first variable resistance section R1 and the magnitude of a resistance value of the second variable resistance section R2 in association with each other to be changed oppositely. The voltage applying section 40 controls the magnitude of the resistance value of the first variable resistance section R1 and the magnitude of the resistance value of the second variable resistance section R2. More preferably, the voltage applying section 40 controls the magnitude of the resistance value of the first variable resistance section R1 and the magnitude of the resistance value of the second variable resistance section R2 to fix a sum of the magnitudes.

In the example shown in FIG. 2, the first variable resistance section R1 includes a resistor R41, a resistor R42, a resistor R43, a switch SW1, a switch SW2, and a switch SW3. The resistor R41, the resistor R42, and the resistor R43 are connected in series. A connected state of the switch SW1, the switch SW2, and the switch SW3 is controlled by the control section 42. The switch SW1 is switched to the connected state by a signal S0 output by the control section 42. In the connected state, the switch SW1 forms a path that bypasses the resistor R41, the resistor R42, and the resistor R43. The switch SW2 is switched to the connected state by a signal S1 output by the control section 42. In the connected state, the switch SW2 forms a path that bypasses the resistor R42 and the resistor R43. The switch SW3 is switched to the connected state by a single S2 output by the control section 42. In the connected state, the switch SW3 forms a path that bypasses the resistor R43.

In the example shown in FIG. 2, the variable resistance section R2 includes a resistor R44, a resistor R45, a resistor R46, a switch SW4, a switch SW5, and a switch SW6. The resistor R44, the resistor R45, and the resistor R46 are connected in series. A connected state of the switch SW4, the switch SW5, and the switch SW6 is switched by the control section 42. The switch SW4 is switched to the connected state by a signal S3 output by the control section 42. In the connected state, the switch SW4 forms a path that bypasses the resistor R44, the resistor R45, and the resistor R46. The switch SW5 is switched to the connected state by the signal S2 output by the control section 42. In the connected state, the switch SW5 forms a path that bypasses the resistor R45 and the resistor R46. The switch SW6 is switched to the connected state by the signal S1 output by the control section 42. In the connected state, the switch SW6 forms a path that bypasses the resistor R46.

Figure 3:
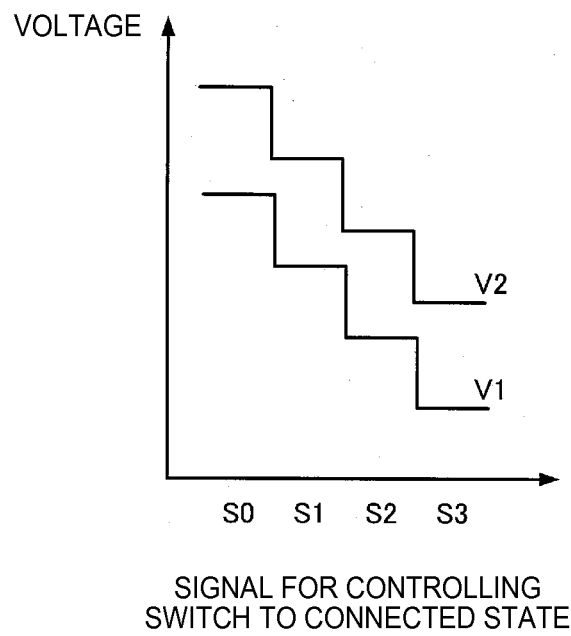
FIG. 3 is a graph schematically showing a relation between signals for controlling switches to a connected state and a first voltage and a second voltage.

FIG. 3 is a graph schematically showing a relation between the signals for controlling the switches SW1 to SW6 to be in the connected state and the first voltage V1 and the second voltage V2. In FIG. 3, resistance values of the resistors R41 to R46 are the same.

In this embodiment, the control section 42 of the voltage applying section 40 controls the magnitude of a resistance value of the first variable resistance section R1 and the magnitude of a resistance value of the second variable resistance section R2 to fix a sum of the magnitudes. Therefore, as shown in FIG. 3, the second voltage V2 is controlled in association with the first voltage V1 to fix a difference between the second voltage V2 and the first voltage V1.

Figure 4:
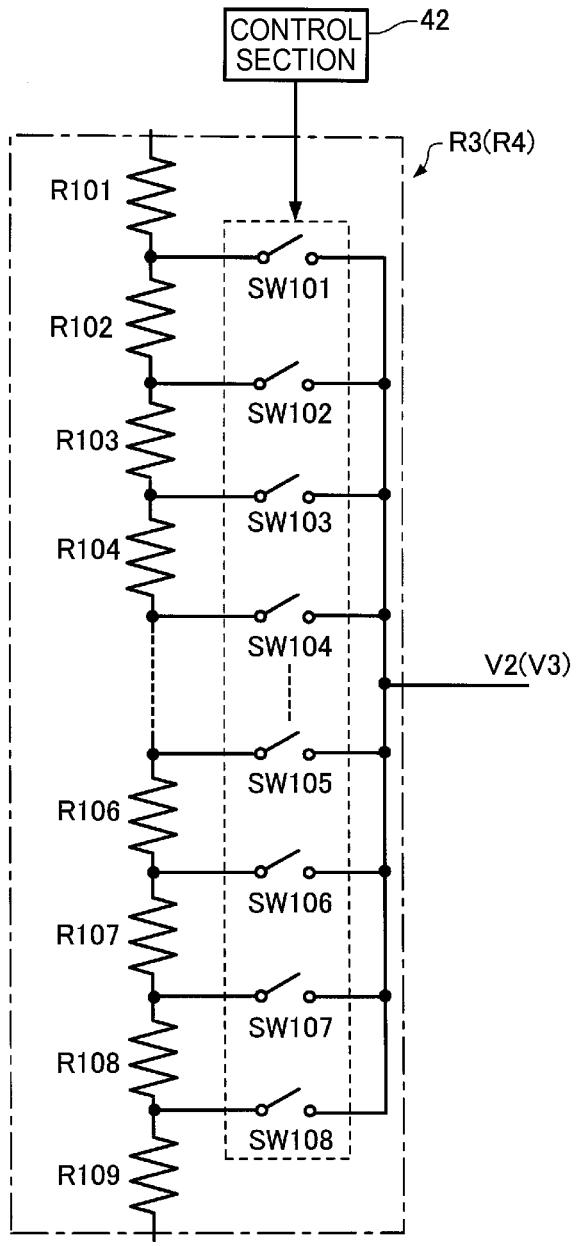
FIG. 4 is a circuit diagram showing a configuration example of resistors.

FIG. 4 is a circuit diagram showing a configuration example of the resistor R3 and the resistor R4. In the example shown in FIG. 4, the resistor R3 and the resistor R4 are configured by a resistance voltage division circuit. The resistance voltage division circuit shown in FIG. 4 includes resistors R101 to R109 and switches SW101 to SW108. The resistors R101 to R109 are connected in series. The control section 42 can control the second voltage V2 and the third voltage V3 by controlling any one of the switches SW101 to SW108 to be in the connected state.

Referring back to FIG. 1, the oscillation circuit 1 may include a temperature-compensation-voltage generating section 70 (a second voltage applying section) and a temperature sensor 71. The temperature-compensation-voltage generating section 70 generates a fourth voltage V4 on the basis of temperature detected by the temperature sensor 71. In the example shown in FIG. 1, the temperature-compensation-voltage generating section 70 applies the fourth voltage V4 to the second terminal 32 of the second characteristic adjusting section 30 and the second terminal 62 of the third characteristic adjusting section 60 via a resistor R11.

In the oscillation circuit 1 shown in FIG. 1, a voltage applied to the first terminal 31 of the second characteristic adjusting section 30 and a voltage applied to the first terminal 61 of the third characteristic adjusting section 60 are different. Consequently, even when elements having the same characteristics are used as the variable capacitance element C2 and the variable capacitance element C3, a capacitance characteristic of the variable capacitance element C2 with respect to the fourth voltage V4 output by the temperature-compensation-voltage generating section 70 and a capacitance characteristic of the variable capacitance element C3 with respect to the fourth voltage V4 can be varied. Therefore, a voltage range in which linearity of a combined capacitance of the variable capacitance element C2 and the variable capacitance element C3 is high can be expanded. By adjusting the first voltage V1 and the third voltage V3 output by the voltage applying section 40, frequency sensitivity of the oscillation circuit 1 to the fourth voltage V4 can be adjusted.

Figure 5A:
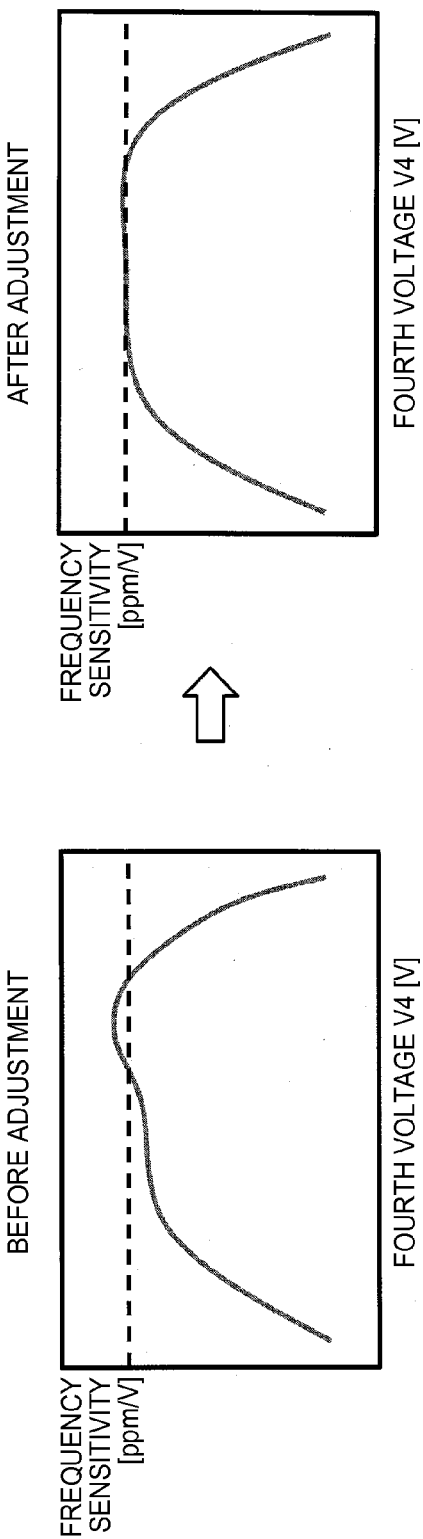
FIG. 5A is a graph schematically showing frequency sensitivity of the oscillation circuit to a fourth voltage output by a temperature-compensation-voltage generating section.
Figure 5B:
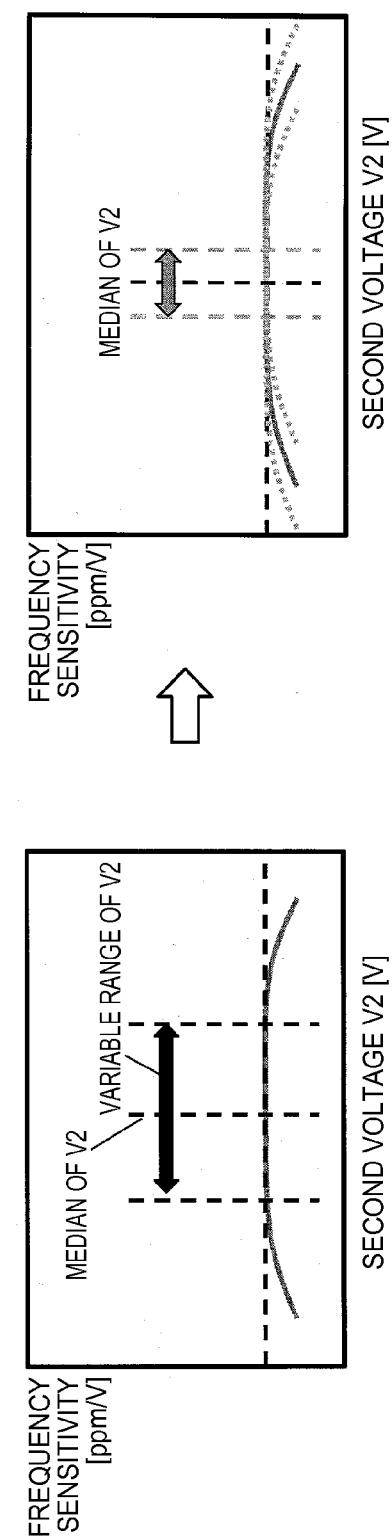
FIG. 5B is a graph schematically showing frequency sensitivity of the oscillation circuit to the second voltage output by the voltage applying section.

FIG. 5A is a graph schematically showing frequency sensitivity of the oscillation circuit 1 to the fourth voltage V4 output by the temperature-compensation-voltage generating section 70. FIG. 5B is a graph schematically showing frequency sensitivity of the oscillation circuit 1 to the second voltage V2 output by the voltage applying section 40. In FIG. 5A, the abscissa represents the fourth voltage V4 (V) and the ordinate represents frequency sensitivity (ppm/V) of the oscillation circuit 1. In FIG. 5B, the abscissa represents the second voltage V2 (V) and the ordinate represents frequency characteristic (ppm/V) of the oscillation circuit 1. In FIGS. 5A and 5B, a state before adjustment of the frequency sensitivity of the oscillation circuit 1 to the fourth voltage V4 is shown on the left side and a state after the adjustment is shown on the right side.

As explained above, by adjusting the first voltage V1 and the third voltage V3 output by the voltage applying section 40, a voltage range in which linearity of the frequency sensitivity of the oscillation circuit 1 to the fourth voltage V4 increases is adjusted to be expanded. In the oscillation circuit 1 according to this embodiment, the voltage applying section 40 changes the second voltage V2 in association with the first voltage V1. Therefore, even if the first voltage V1 fluctuates, a fluctuation in a voltage applied between the first terminal 21 and the second terminal 22 of the first characteristic adjusting section 20 can be suppressed. In particular, when the voltage applying section 40 changes the second voltage V2 to fix a difference between the second voltage V2 and the first voltage V1, in a frequency sensitivity characteristic of the oscillation circuit 1 to the second voltage V2, although a median of the second voltage V2 fluctuates, a characteristic based on the median of the second voltage V2 does not fluctuate.

As explained above, with the oscillation circuit 1 according to this embodiment, the voltage applying section 40 changes the second voltage V2 in association with the first voltage V1. Therefore, when the variable capacitance element C1 is used in the first characteristic adjusting section 20 and the variable capacitance element C2 is used in the second characteristic adjusting section 30, a median of a voltage between both ends of the first characteristic adjusting section 20 is easily set in a range in which linearity of the variable capacitance element C1 is high. The first characteristic adjusting section 20 and the second characteristic adjusting section 30 can be independently controlled. Therefore, for example, when the variable capacitance element C1 is used in the first characteristic adjusting section 20 and the variable capacitance element C2 is used in the second characteristic adjusting section 30, compared with when frequency adjustment is performed by one variable capacitance element, a variable width of the frequency adjustment can be increased. Therefore, it is possible to realize the oscillation circuit 1 that can increase the variable width while suppressing deterioration in accuracy of the frequency adjustment.

With the oscillation circuit 1 according to this embodiment, by controlling voltages between both terminals of the variable capacitance element C1 and the variable capacitance element C2 to thereby control capacitance values of the variable capacitance element C1 and the variable capacitance element C2, it is possible to control the frequency of an oscillation signal output by the oscillation circuit 1.

With the oscillation circuit 1 according to this embodiment, by changing the magnitudes of resistance values of the first variable resistance section R1 and the second variable resistance section R2 in association with each other, the second voltage V2 and the first voltage V1 can be changed in association with each other. Therefore, it is possible to realize the oscillation circuit 1 that can increase a variable width of frequency adjustment while suppressing deterioration in accuracy of the frequency adjustment.

The oscillation circuit 1 according to this embodiment may further include a storing section 50 that store setting information. As the storing section 50, various configurations such as a ROM (Read Only Memory), a RAM (Random Access Memory), and a nonvolatile memory can be adopted according to the intended purposes of the storing section 50. The voltage applying section 40 may control the first voltage V1, the second voltage V2, and the third voltage V3 on the basis of the setting information stored in the storing section 50.

With the oscillation circuit 1 according to this embodiment, the first voltage V1 and the second voltage V2 can be controlled on the basis of the setting information stored in the storing section 50. Therefore, it is possible to easily use a desired frequency as the frequency of the oscillation signal output by the oscillation circuit 1.

With the oscillator 1000 according to this embodiment, since the oscillator 1000 includes the oscillation circuit 1 that can increase a variable width of frequency adjustment while suppressing deterioration in accuracy of the frequency adjustment, it is possible to realize the oscillator 1000 that can increase a variable width of frequency adjustment while suppressing deterioration in accuracy of the frequency adjustment.

1-2. Second Embodiment

Figure 6:
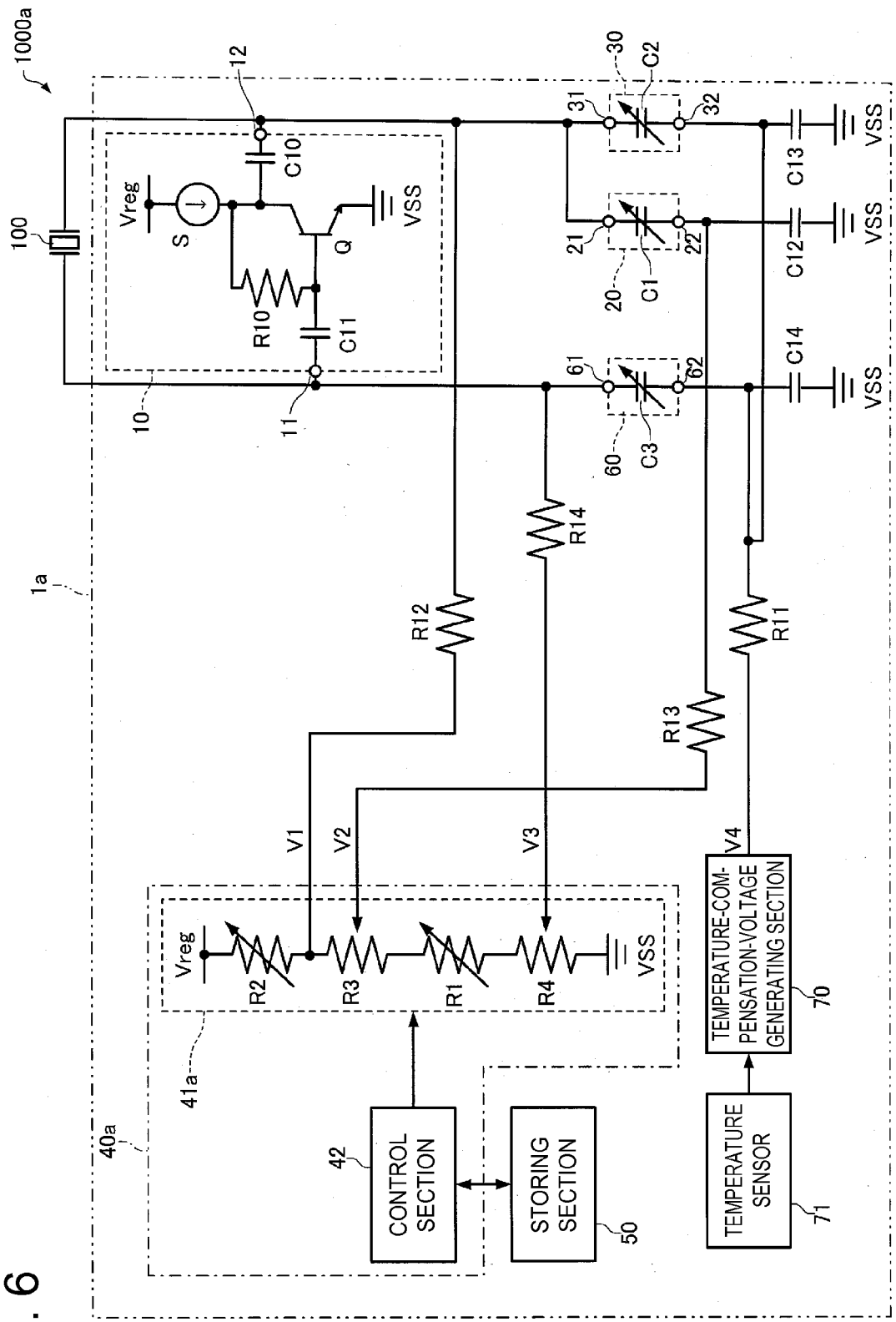
FIG. 6 is a circuit diagram showing an oscillation circuit and an oscillator according to a second embodiment.

FIG. 6 is a circuit diagram showing an oscillation circuit 1a and an oscillator 1000a according to a second embodiment. Components that are the same as the components of the oscillation circuit 1 and the oscillator 1000 shown in FIG. 1 are denoted by the same reference numerals and signs. Detailed explanation of these components is omitted.

The oscillation circuit 1a according to this embodiment is different from the oscillation circuit 1 according to the first embodiment in that the first characteristic adjusting section 20 and the second characteristic adjusting section 30 are connected to the second terminal 12 of the oscillating section 10 and the third characteristic adjusting section 60 is connected to the first terminal 11 of the oscillating section 10. Further, the oscillation circuit 1a is different from the oscillation circuit 1 according to the first embodiment in that connection order of the first variable resistance section R1, the second variable resistance section R2, the resistor R3, and the resistor R4 included in a voltage generating section 41a of a voltage applying section 40a is opposite to the connection order of the first variable resistance section R1, the second variable resistance section R2, the resistor R3, and the resistor R4 included in the voltage generating section 41 in the first embodiment.

In the oscillation circuit 1a and the oscillator 1000a according to the second embodiment, effects that are the same as the effects of the oscillation circuit 1 and the oscillator 1000 according to the first embodiment are attained for the same reasons.

1-3. Third Embodiment

Figure 7:
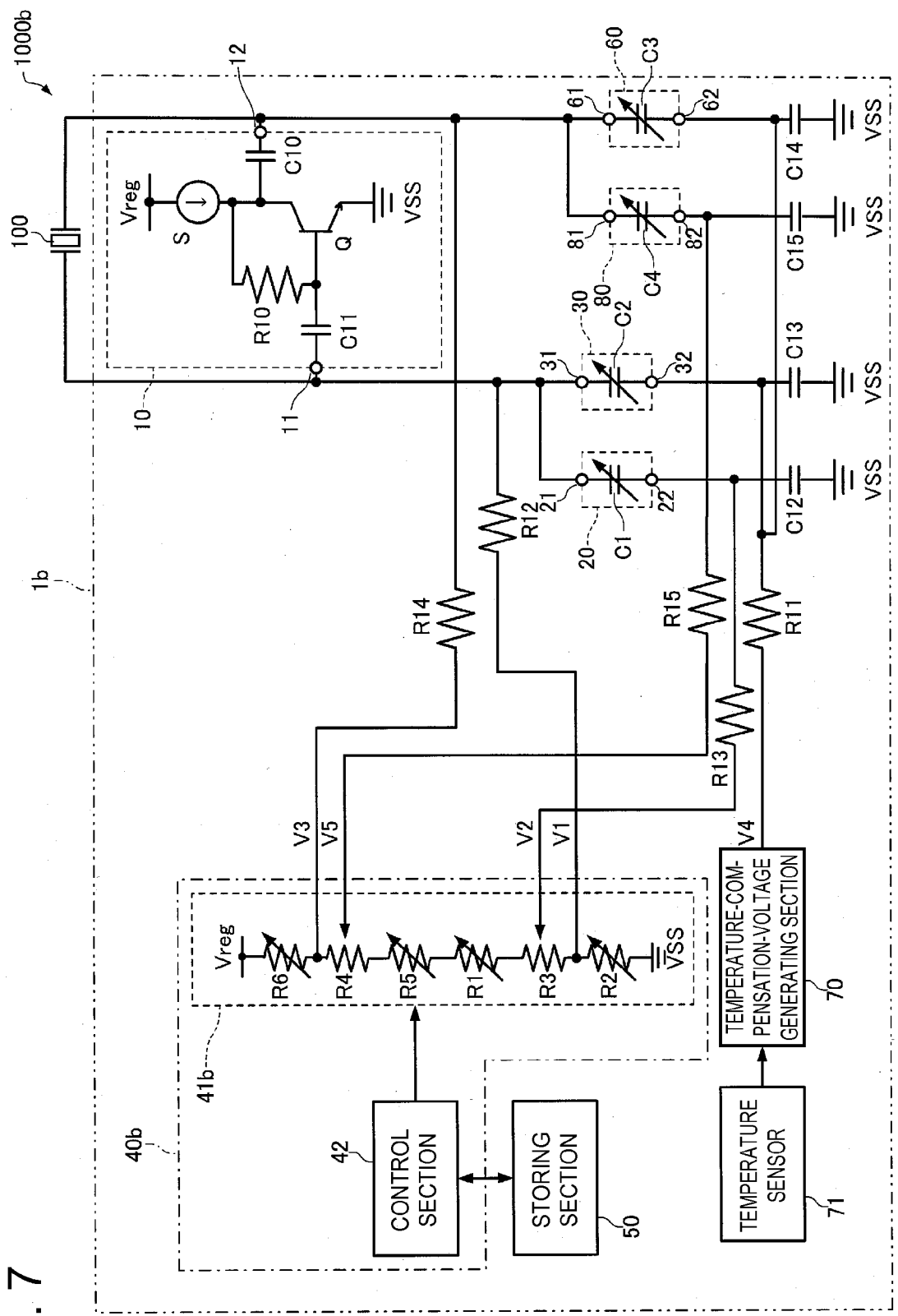
FIG. 7 is a circuit diagram showing an oscillation circuit and an oscillator according to a third embodiment.

FIG. 7 is a circuit diagram showing an oscillation circuit 1b and an oscillator 1000b according to a third embodiment. Components that are the same as the components of the oscillation circuit 1 and the oscillator 1000 shown in FIG. 1 are denoted by the same reference numerals and signs. Detailed explanation of these components is omitted.

The oscillation circuit 1b according to this embodiment is different from the oscillation circuit 1 according to the first embodiment in that the oscillation circuit 1b includes a fourth characteristic adjusting section 80 that adjusts characteristics of an oscillation signal output by the oscillating section 10.

The fourth characteristic adjusting section 80 includes a variable capacitance element C4, a first terminal 81, and a second terminal 82. The first terminal 81 of the fourth characteristic adjusting section 80 is connected to the second terminal 12 of the oscillating section 10. The second terminal 82 of the fourth adjusting section 80 is connected to the ground potential VSS via a capacitive element C15.

The oscillation circuit 1b according to this embodiment is different from the oscillation circuit 1 according to the first embodiment in that, in a voltage generating section 41b of a voltage applying section 40b, a second variable resistance section R6, the resistor R4, a first variable resistance section R5, the first variable resistance section R1, the resistor R3, and the second variable resistance section R2 are connected in this order in series from the power supply potential Vreg to the ground potential VSS.

The voltage applying section 40b applies a fifth voltage V5 which is different from the first voltage V1, the second voltage V2, and the third voltage V3 to the second terminal 82 of the fourth characteristic adjusting section 80. In an example shown in FIG. 7, the voltage generating section 41b applies a voltage generated by the resistor R4 to the second terminal 82 of the fourth characteristic adjusting section 80 via a resistor R15.

The configuration of the first variable resistance section R5 and the second variable resistance section R6 is the same as the configuration of the first variable resistance section R1 and the second variable resistance section R2.

The voltage applying section 40b changes the fifth voltage V5 in association with the third voltage V3. Preferably, the voltage applying section 40b changes the fifth voltage V5 to set the magnitude of a change of a difference between the third voltage V3 and the fifth voltage V5 to be smaller than the magnitude of a change in the third voltage V3. More preferably, the voltage applying section 40b changes the fifth voltage V5 to fix the difference between the third voltage V3 and the fifth voltage V5.

With the oscillation circuit 1b according to this embodiment, the voltage applying section 40b changes the fifth voltage V5 in association with the third voltage V3. Therefore, for example, when the variable capacitance element C3 is used in the third characteristic adjusting section 60 and the variable capacitance element C4 is used in the fourth characteristic adjusting section 80, a median of a voltage between both ends of the fourth characteristic adjusting section 80 is easily set in a range in which linearity of the variable capacitance element C4 is high. The third characteristic adjusting section 60 and the fourth characteristic adjusting section 80 can be independently controlled. Therefore, for example, when the variable capacitance element C3 is used in the third characteristic adjusting section 60 and the variable capacitance element C4 is used in the fourth characteristic adjusting section 80, compared with when frequency adjustment is performed by one variable capacitance element, a variable width of the frequency adjustment can be increased. Therefore, it is possible to realize the oscillation circuit 1b that can increase the variable width while suppressing deterioration in accuracy of the frequency adjustment.

In addition, in the oscillation circuit 1b and the oscillator 1000b according to the third embodiment, effects that are the same as the effects of the oscillation circuit 1 and the oscillator 1000 according to the first embodiment are attained for the same reasons.

2. Electronic Apparatus

Figure 8:
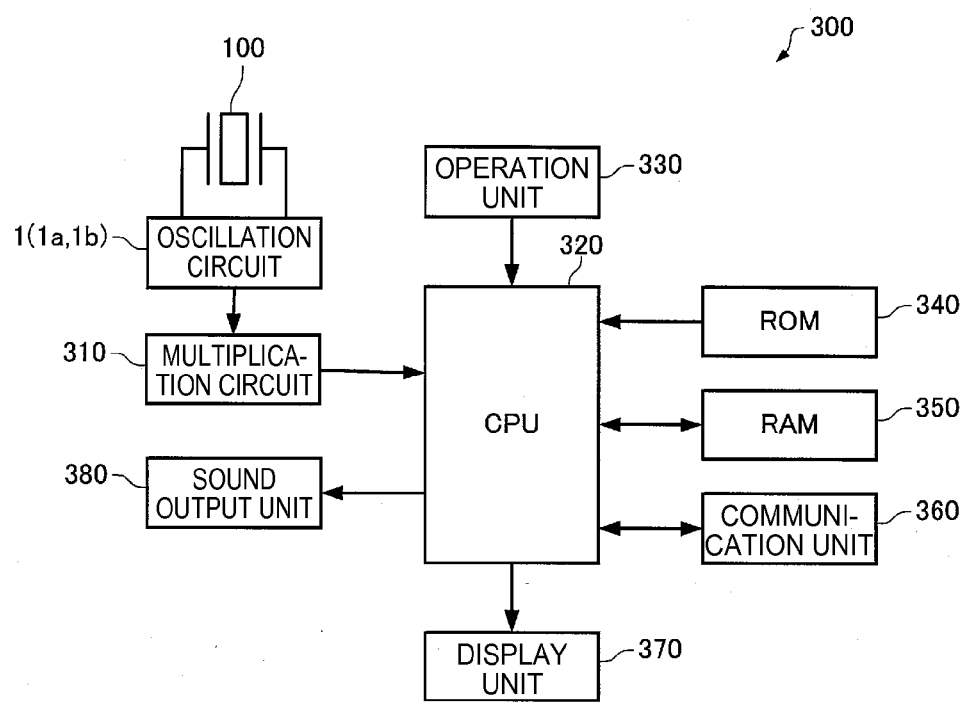
FIG. 8 is a functional block diagram of an electronic apparatus according to an embodiment.

FIG. 8 is a functional block diagram of an electronic apparatus 300 according to an embodiment. Note that components that are the same as the components in the embodiments explained above are denoted by the same reference numerals and signs. Detailed explanation of these components is omitted.

The electronic apparatus 300 according to this embodiment includes any one of the oscillation circuit 1, the oscillation circuit 1a, the oscillation circuit 1b, the oscillator 1000, the oscillator 1000a, and the oscillator 1000b. In FIG. 8, the electronic apparatus 300 including the oscillation circuit 1 is shown. In an example shown in FIG. 8, the electronic apparatus 300 includes the resonator 100, the oscillation circuit 1, a multiplication circuit 310, a CPU (Central Processing Unit) 320, an operation unit 330, a ROM (Read Only Memory) 340, a RAM (Random Access Memory) 350, a communication unit 360, a display unit 370, and a sound output unit 380. Note that, in the electronic apparatus 300 according to this embodiment, a part of the components (the units) shown in FIG. 8 may be omitted or changed. Other components may be added to the electronic apparatus 300.

The multiplication circuit 310 supplies a clock pulse not only to the CPU 320 but also to the units (not shown in the figure). The clock pulse may be, for example, a signal obtained by extracting, with the multiplication circuit 310, a desired harmonic signal from an oscillation signal received from the oscillation circuit 1 connected to the resonator 100 or may be a signal obtained by multiplying the oscillation signal received from the oscillation circuit 1 with the multiplication circuit 310 including a PLL synthesizer.

The CPU 320 performs, according to computer programs stored in the ROM 340 and the like, various kinds of calculation processing and control processing using the clock pulse output by the multiplication circuit 310. Specifically, the CPU 320 performs, for example, various kinds of processing corresponding to an operation signal received from the operation unit 330, processing for controlling the communication unit 360 in order to perform data communication with the outside, processing for transmitting a display signal for causing the display unit 370 to display various kinds of information, processing for causing the sound output unit 380 to output various kinds of sound.

The operation unit 330 is an input device configured by operation keys, button switches, and the like. The operation unit 330 outputs an operation signal corresponding to operation by a user to the CPU 320.

The ROM 340 stores computer programs, data, and the like for the CPU 320 to perform various kinds of calculation processing and control processing.

The RAM 350 is used as a work area of the CPU 320. The RAM 350 temporarily stores computer programs and data read out from the ROM 340, data input from the operation unit 330, results of calculations executed by the CPU 320 according to various computer programs, and the like.

The communication unit 360 performs various kinds of control for establishing data communication between the CPU 320 and an external apparatus.

The display unit 370 is a display device configured by an LCD (Liquid Crystal Display), an electrophoretic display, or the like. The display unit 370 displays various kinds of information on the basis of a display signal input from the CPU 320.

The sound output unit 380 is a device that outputs sound such as a speaker.

As the electronic apparatus 300, various electronic apparatuses are conceivable. Examples of the electronic apparatuses include personal computers (e.g., a mobile personal computer, a laptop personal computer, and a tablet personal computer), mobile terminals such as a cellular phone, a digital still camera, an inkjet-type discharge apparatus (e.g., an inkjet printer), storage area network apparatuses such as a router and a switch, a local area network apparatus, an apparatus for a moving object terminal station, a television, a video camera, a video recorder, a car navigation apparatus, a pager, an electronic notebook (including an electronic notebook with a communication function), an electronic dictionary, an electronic calculator, an electronic game machine, a controller for a game, a word processor, a work station, a video phone, a security television monitor, an electronic binocular, a POS (point of ale) terminal, medical apparatuses (e.g., an electronic thermometer, a blood manometer, a blood sugar meter, an electrocardiogram apparatus, an ultrasonic diagnostic apparatus, and an electronic endoscope), a fish finder, various measuring apparatuses, meters (e.g., meters for a vehicle, an airplane, and a ship), a flight simulator, a head mounted display, motion trace, motion tracking, a motion controller, and PDR (pedestrian dead reckoning).

Figure 9:
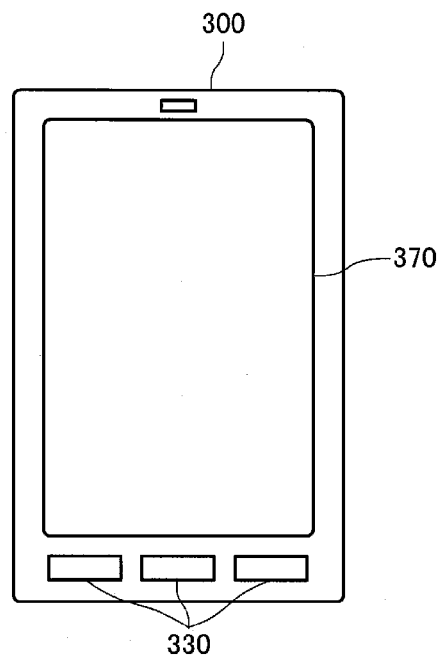
FIG. 9 is a diagram showing an example of an external appearance of a smartphone, which is an example of the electronic apparatus.

FIG. 9 is a diagram showing an example of an external appearance of a smartphone, which is an example of the electronic apparatus 300. The smartphone, which is the electronic apparatus 300, includes buttons as the operation unit 330 and includes an LCD as the display unit 370.

With the electronic apparatus 300 according to this embodiment, the electronic apparatus 300 includes any one of the oscillation circuit 1, the oscillation circuit 1a, the oscillation circuit 1b, the oscillator 1000, the oscillator 1000a, and the oscillator 1000b that can increase a variable width of frequency adjustment while suppressing deterioration in accuracy of the frequency adjustment. Therefore, it is possible to realize the electronic apparatus 300 with high accuracy of an operation.

3. Moving Object

Figure 10:
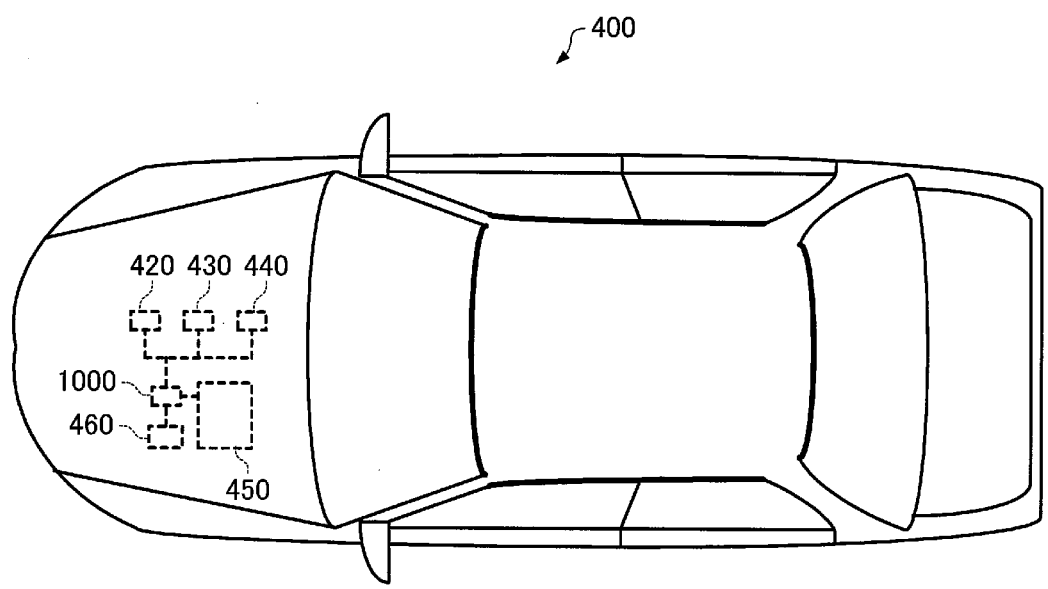
FIG. 10 is a diagram (a top view) showing an example of a moving object according to the embodiment.

FIG. 10 is a diagram (a top view) showing an example of a moving object 400 according to an embodiment. Note that components same as the components in the embodiments explained above are denoted by the same reference numerals and signs. Detailed explanation of the components is omitted.

The moving object 400 according to this embodiment includes any one of the oscillation circuit 1, the oscillation circuit 1a, the oscillation circuit 1b, the oscillator 1000, the oscillator 1000a, and the oscillator 1000b. In FIG. 10, the moving object 400 including the oscillator 1000 including the oscillation circuit 1 is shown. In the example shown in FIG. 10, the moving object 400 includes a controller 420, a controller 430, and a controller 440 for performing various kinds of control for an engine system, a brake system, and a key-less entry system, a battery 450, and a backup battery 460. Note that, in the moving object 400 according to this embodiment, apart of the components (units) shown in FIG. 10 may be omitted or changed. Other components may be added to the moving object 400.

With the moving object 400 according to this embodiment, the moving object 400 includes any one of the oscillation circuit 1, the oscillation circuit 1a, the oscillation circuit 1b, the oscillator 1000, the oscillator 1000a, and the oscillator 1000b that can increase a variable width of frequency adjustment while suppressing deterioration in accuracy of the frequency adjustment. Therefore, it is possible to realize the moving object 400 with high accuracy of an operation.

As the moving object 400, various moving objects are conceivable. Examples of the moving object 400 include an automobile (including an electric vehicle), airplanes such as a jet airplane and a helicopter, a ship, a rocket, and an artificial satellite.

Several embodiments and modifications are explained above. However, the invention is not limited to the embodiments and the modifications thus described. The invention can be carried out in various forms without departing from the spirit of the invention.

The invention includes components substantially the same as the components explained in the embodiments (e.g., components having the same functions, methods, and results or components having the same purposes and effects). The invention includes components in which non-essential portions of the components explained in the embodiments are replaced. The invention includes components that can realize action and effects or attain objects that are the same as those of the components explained in the embodiments. The invention includes components in which known techniques are added to the components explained in the embodiments.

The entire disclosure of Japanese Patent Application No. 2013-267751 filed Dec. 25, 2013 is expressly incorporated by reference herein.

What is claimed is:

1. An oscillation circuit comprising:
an oscillating section configured to output an oscillation signal;
a first characteristic adjusting section and a second characteristic adjusting section including first terminals respectively electrically connected to the oscillating section, the first and second characteristic adjusting sections being configured to adjust characteristics of the oscillation signal; and
a voltage applying section configured to:
apply a first voltage to the first terminal of the first characteristic adjusting section and the first terminal of the second characteristic adjusting section; and
apply a second voltage, which is different from the first voltage and changes in association with the first voltage, to a second terminal of the first characteristic adjusting section, wherein the second voltage is changed to have a difference between the first voltage and the second voltage be less than the first voltage.

2. The oscillation circuit according to claim 1, wherein the first characteristic adjusting section and the second characteristic adjusting section include variable capacitance elements.

3. The oscillation circuit according to claim 1, wherein the voltage applying section includes a first variable resistance section and a second variable resistance section connected in series via a resistor, the voltage applying section outputting the first voltage and the second voltage from between the first variable resistance section and the second variable resistance section, and oppositely changing a resistance of the first variable resistance section and a resistance of the second variable resistance section.

4. The oscillation circuit according to claim 1, further comprising a memory configured to store setting information for changing the first voltage and the second voltage in association with each other, wherein
the voltage applying section controls the first voltage and the second voltage based on the setting information.

5. An oscillation circuit comprising:
an oscillating section configured to output an oscillation signal;
a first characteristic adjusting section and a second characteristic adjusting section electrically connected to the oscillating section and configured to adjust characteristics of the oscillation signal; and a voltage applying section configured to:
- output a first voltage and a second voltage which is different from the first voltage to the first characteristic adjusting section and the second characteristic adjusting section,
- apply the first voltage to the second characteristic adjusting section, and
- apply a differential voltage between the first voltage and the second voltage, which changes in association with the first voltage, to the first characteristic adjusting section, wherein the second voltage is changed to have a difference between the first voltage and the second voltage be less than the first voltage.

6. An oscillator comprising:
the oscillation circuit according to claim 1; and
a resonator.

7. An oscillator comprising:
the oscillation circuit according to claim 2; and
a resonator.

8. An oscillator comprising:
the oscillation circuit according to claim 3; and
a resonator.

9. An oscillator comprising:
the oscillation circuit according to claim 4; and
a resonator.

10. An oscillator comprising:
the oscillation circuit according to claim 5; and
a resonator.

11. An electronic apparatus comprising the oscillation circuit according to claim 1.

12. An electronic apparatus comprising the oscillation circuit according to claim 5.

13. A moving object comprising the oscillation circuit according to claim 1.

14. A moving object comprising the oscillation circuit according to claim 5.

* * * * *